United States Patent
Bhatia et al.

(10) Patent No.: US 10,680,647 B2
(45) Date of Patent: Jun. 9, 2020

(54) MIN-SUM DECODING FOR LDPC CODES

(71) Applicant: SK hynix Inc., Gyeonggi-do (KR)

(72) Inventors: Aman Bhatia, San Jose, CA (US); Naveen Kumar, San Jose, CA (US); Abhiram Prabhakar, San Jose, CA (US); Chenrong Xiong, San Jose, CA (US); Fan Zhang, Fremont, CA (US)

(73) Assignee: SK hynix Inc., Gyeonggi-do (KR)

( * ) Notice: Subject to any disclaimer, the term of this patent is extended or adjusted under 35 U.S.C. 154(b) by 288 days.

(21) Appl. No.: 15/903,604

(22) Filed: Feb. 23, 2018

(65) Prior Publication Data

US 2019/0097656 A1      Mar. 28, 2019

Related U.S. Application Data

(60) Provisional application No. 62/562,901, filed on Sep. 25, 2017.

(51) Int. Cl.
*G06F 11/00* (2006.01)
*H03M 13/11* (2006.01)
*H03M 13/00* (2006.01)

(52) U.S. Cl.
CPC ...... *H03M 13/1117* (2013.01); *H03M 13/112* (2013.01); *H03M 13/1131* (2013.01); *H03M 13/1177* (2013.01); *H03M 13/616* (2013.01); *H03M 13/6502* (2013.01); *H03M 13/1108* (2013.01)

(58) Field of Classification Search
CPC .. H03M 13/00; H03M 13/11; H03M 13/1108; H03M 13/1117; H03M 13/112; H03M 13/1131; H03M 13/1177; H03M 13/27; H03M 13/616; H03M 13/6502; H04J 13/18; H04L 1/00

See application file for complete search history.

(56) References Cited

U.S. PATENT DOCUMENTS

| | | | |
|---|---|---|---|
| 8,201,049 B2 | 6/2012 | Lu | |
| 8,359,522 B2 | 1/2013 | Gunnam et al. | |
| 9,778,979 B2 * | 10/2017 | Shin | G06F 11/1012 |
| 2003/0229843 A1 * | 12/2003 | Yu | H03M 13/1111 |
| | | | 714/794 |

(Continued)

*Primary Examiner* — Albert Decady
*Assistant Examiner* — Enamul M Kabir
(74) *Attorney, Agent, or Firm* — Kilpatrick Townsend & Stockton LLP

(57) ABSTRACT

Techniques are described for performing a check node update (CNU) as part of iterative decoding of a low density-parity check (LDPC) code. The CNU uses a min-sum decoding approach that monitors whether two values received in messages from two variable nodes connected to a check nodes are equal and are the minimum value among the values received by the check nodes from other variable nodes connected thereto. Upon detecting such an event, the minimum value is adjusted by reducing it by an adjustment value to generate an adjusted minimum value. This adjusted minimum value approximates the minimum value that a sum-product algorithm (SPA) decoding approach would have generated. The adjusted minimum value is included in a response message sent from the check node to a variable node. The bit corresponding to that variable node is decoded based on this adjusted minimum value.

20 Claims, 9 Drawing Sheets

(56) References Cited

U.S. PATENT DOCUMENTS

| | | | |
|---|---|---|---|
| 2010/0042890 A1* | 2/2010 | Gunnam | H03M 13/1111 |
| | | | 714/752 |
| 2013/0212447 A1* | 8/2013 | Li | H03M 13/6343 |
| | | | 714/763 |
| 2014/0208180 A1* | 7/2014 | Li | H03M 13/112 |
| | | | 714/752 |
| 2016/0191079 A1* | 6/2016 | Zuo | H03M 13/1117 |
| | | | 714/752 |
| 2016/0233884 A1* | 8/2016 | Sedighi | H03M 13/112 |
| 2017/0149445 A1* | 5/2017 | Liu | H03M 13/616 |
| 2018/0041227 A1* | 2/2018 | Lee | H03M 13/1125 |

* cited by examiner

600

Vary a first minimum value while maintaining a second minimum value, the first and second minimum values associated with reliabilities of bit values 602

Measure a first output of a first CNU and a second output of a second CNU when varying the first minimum value and maintaining the second minimum value 604

Generate curves showing the measurements as a function of the variable first minimum value 606

Determine a gap between the first output and the second output based on the measurements 608

Set an adjustment value based on the gap 610

FIG. 6

MIN-SUM DECODING FOR LDPC CODES

CROSS-REFERENCES TO RELATED APPLICATIONS

The present application claims priority to Provisional Application No. 62/562,901 entitled "MIN-SUM DECODING FOR LDPC CODES," filed Sep. 25, 2017, which is assigned to the assignee hereof and expressly incorporated by reference herein in its entirety.

BACKGROUND

Data integrity is an important feature for any data storage device and data transmission. Use of strong error-correction codes (ECCs) is recommended for various types of data storage devices include NAND flash memory devices. ECCs are also frequently used during the process of data transmission.

Error correcting code (ECC) refers to codes that add redundant data, or parity data, to a message, such that the message can be recovered by a receiver even when a number of errors were introduced, either during the process of transmission, or storage. In general, the ECC can correct the errors up to the capability of the code being used.

Low-density parity-check (LDPC) codes are an example of ECC. Generally, an LDPC decoder uses an iterative decoding process to decode information bits. The iterative decoding consumes time and levies a processing burden. LDPC codes show excellent error-correction performance (e.g., bit error rate, code failure rate, etc.) with the iterative sum-product algorithm (SPA). However, the implementation cost of SPA (e.g., circuit area, power consumption, processing cycles, latency, etc.) can be prohibitive. For low-cost implementations, LDPC codes are decoded using iterative min-sum (MS) decoder. While MS decoder has low implementation cost (e.g., circuit area, power consumption, processing cycles, latency, etc.), it causes performance degradation (e.g., bit error rate, code failure rate, etc.) compared to SPA.

BRIEF SUMMARY

Techniques for improving the performance (e.g., bit error rate, code failure rate, etc.) of LDPC decoding relative to min-sum decoding, while reducing the implementation cost (e.g., circuit area, power consumption, processing cycles, latency, etc.) relative to sum-product algorithm (SPA) decoding are described. More specifically, systems and methods are described for improving the performance while reducing the implementation cost. In an example, a system performs a low density-parity check (LDPC) method involving a MS based decoding approach and implemented on an LDPC decoder. The LDPC method includes receiving, by a check node of the LDPC decoder from a first variable node of the LDPC decoder, a first value indicating a reliability of a bit value for a first bit of an LDPC codeword. The first variable node corresponds to the first bit and is connected to the check node. The method also includes determining, by the check node, that the first value is equal to a minimum value stored by the check node for a second variable node of the LDPC decoder. The second variable node corresponds to a second bit of the LDPC codeword and is connected to the check node. The method also includes generating, by the check node in response to determining that the first value is equal to the minimum value, an adjusted minimum value by at least updating the minimum value according to an adjustment value. The method also includes sending, by the check node to a third variable node of the LDPC decoder, the adjusted minimum value. The third variable node corresponds to a third bit of the LDPC codeword and is connected to the check node. The third bit is decoded based on the adjusted minimum value.

In an example, the LDPC decoder is a soft input decoder. The adjustment value is elected from a range of 0.6 and 0.9. For instance, the adjustment value is set as 0.75. In another example, the LDPC decoder is a hard input decoder. The adjustment value is set as an integer. For instance, the integer is set as one. In yet another example, the LDPC decoder uses iterative LDPC decoding. The adjustment value changes based on an iteration number of the iterative LDPC decoding. For instance, the adjustment value increases with an increase of the iteration number.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 6 illustrates an example flow 600 for defining an adjustment value based on a simulation of a check node update using min-sum decoding and a check node update using a sum-product algorithm decoding, in accordance with certain embodiments of the present disclosure.

DETAILED DESCRIPTION

Embodiments of the present disclosure involve improving the performance (e.g., bit error rate, code failure rate, etc.)

of LDPC decoding relative to min-sum (MS) decoding, while reducing the implementation cost (e.g., circuit area, power consumption, processing cycles, latency, etc.) relative to sum-product algorithm (SPA) decoding are described. In other words, whereas existing solutions implement MS decoding or SPA decoding given a tradeoff between the performance and implementation cost, embodiments herein avoid such a tradeoff. Instead, the best of both decoding approaches becomes possible: an improved performance at a low cost implementation. This translates into an LDPC decoding system that has a small circuit area, a low power consumption, less processing cycles, a short latency similar to an MS decoder while achieving a bit error rate and a code failure rate similar to an SPA decoder.

In an example, the LDPC decoding system implements a modified MS decoding approach. In particular, typical MS decoding is used as part of the iterative LDPC decoding. However, when a check node detects that two incoming values passed from two variable nodes are equal and are the minimum among values passed from other connected nodes, the check node adjusts the value it sends out to these other connected nodes. These values indicate reliability of bit values for bits in a codeword (e.g., the higher the value, the more likely a bit is a "0" or a "1" depending on a sign). For instance, these values correspond to the magnitudes of bit log-likelihood ratios (LLRs). Rather than sending the minimum value, the check node adjusts this minimum by an adjustment value to generate an adjusted minimum value and sends this adjusted minimum value out. For example, the minimum value is reduced by "0.75" or some other adjustment value. The decoding then occurs based on this adjusted minimum value.

Many technical advantages for using the modified MS decoding approach (e.g., the adjusted minimum value rather than the minimum value) exist. Specifically, MS decoding tends to overestimate values exchanged between the nodes, which degrades the performance relative to SPA decoding. In the event when a check node receives two values that are equal and are the minimum, the MS decoding's overestimation is the largest relative to the SPA decoding. Hence, by adjusting the minimum value when the event is detected, this large overestimation can be reduced or even eliminated to approximate the performance of the SPA decoding. In an example, the adjustment value reduces the minimum value (which the MS decoding overestimates) to the likely minimum value that the SPA decoding would have computed. Thus, the performance of the MS decoding is significantly improved and becomes similar to the performance of the SPA decoding without the implementation cost impact of the SPA decoding.

Figure 7:
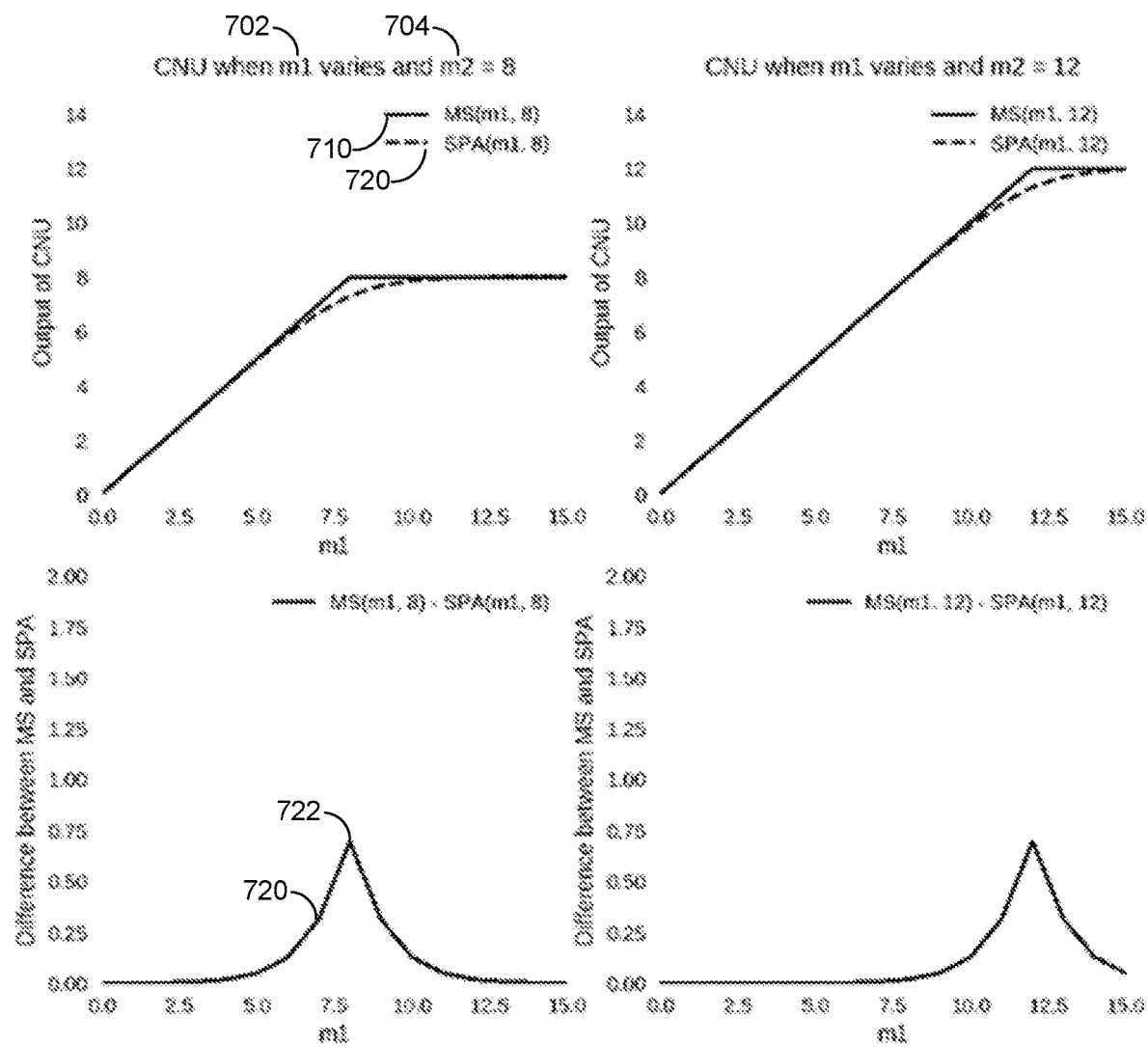
FIG. 7 illustrates example simulations of check node updates using min-sum decoding and sum-product algorithm (SPA) decoding, in accordance with certain embodiments of the present disclosure.

To illustrate, and referring back to the example of the adjustment value of "0.75," simulation of soft output iterative LDPC decoding indicates that the largest gap between the MS decoding and SPA decoding performances occurs when the above event is detected. An example of this simulation and gap is illustrated in FIG. 7. The "0.75" adjustment value corresponds to the largest size of the gap. Accordingly, the overestimated minimum value of the MS decoding is reduced by "0.75" to become equal to the more accurate estimation of the SPA decoding's minimum value. Thereafter, this more accurate, adjusted minimum value is used in the decoding, thereby improving the performance of the MS decoding. These and other features of the modified MS decoding approach are further illustrated in the next figures.

Figure 1:
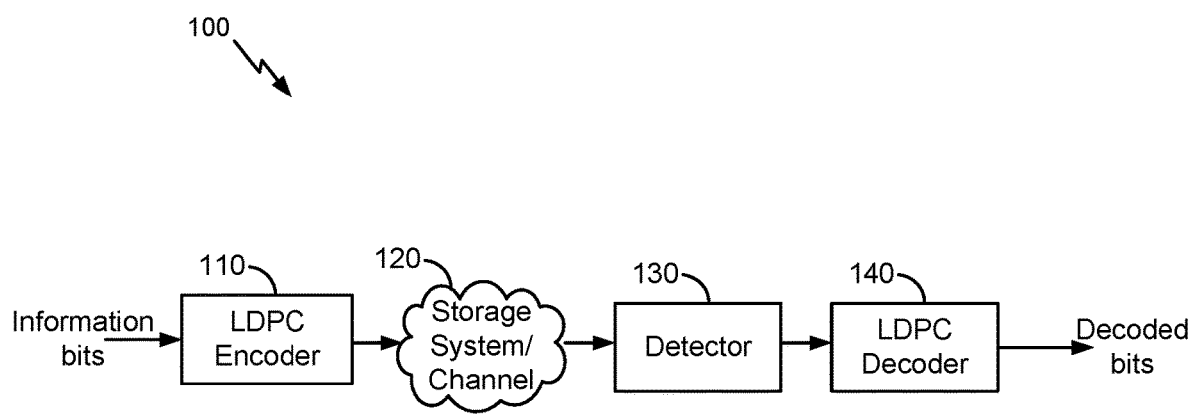
FIG. 1 illustrates an example high level block diagram of an error correcting system, in accordance with certain embodiments of the present disclosure.

FIG. 1 illustrates an example high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the codeword and the other set of nodes, e.g., check nodes, correspond to the set of parity-check constraints satisfied by the codeword. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figures 2A, 2B:
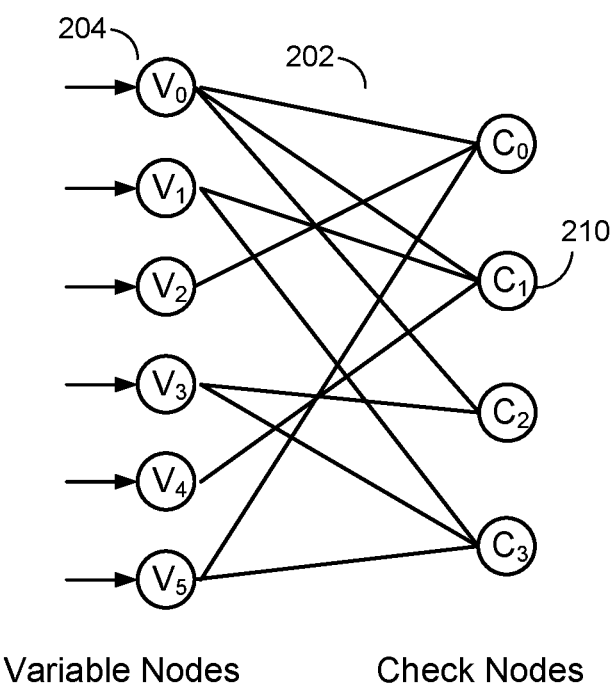
FIGS. 2A-2B illustrate an example parity-check matrix and an example graph representing the parity-check matrix, in accordance with certain embodiments of the present disclosure.

FIG. 2A illustrates an example parity-check matrix H 200 and FIG. 2B illustrates an example bipartite graph corresponding to the parity-check matrix 200, in accordance with certain embodiments of the present disclosure. In this example, the parity-check matrix 200 has six column vectors and four row vectors. Network 202 shows the network corresponding to the parity-check matrix 200 and represent a bipartite graph. Various type of bipartite graphs are possible, including, for example, a Tanner graph.

Generally, the variable nodes in the network 202 correspond to the column vectors in the parity-check matrix 200. The check nodes in the network 202 correspond to the row vectors of the parity-check matrix 200. The interconnections between the nodes are determined by the values of the parity-check matrix 200. Specifically, a "1" indicates the corresponding check node and variable nodes have a connection. A "0" indicates there is no connection. For example, the "1" in the leftmost column vector and the second row vector from the top in the parity-check matrix 200 corresponds to the connection between the variable node 204 and the check node 210.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes, as shown in FIG. 2B. The connections between variable nodes and check nodes are described by and correspond to the values of the parity-check matrix 200, as shown in FIG. 2A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. This step can be referred as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes, also include reliability of each bit.

An example message passing algorithm may be performed. In this example, L(qij) represents a message that is sent by variable node $v_i$ to check node $c_j$; L($r_{ji}$) represents the message sent by check node $c_j$ to variable node $v_i$; and L($c_i$) represents initial LLR value for each variable node $v_i$. Variable node processing for each L(qij) can be done through the following steps:

(1) Read L($c_i$) and L($r_{ji}$) from memory.
(2) Calculate L(Qi-sum)=L($c_i$)+Scaling Factor*$\Sigma_{j \in c_i}$L($r_{ij}$).
(3) Calculate each L(Qi-sum)−L($r_{ij}$).
(4) Output L(Qi-sum) and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each L(rji) can be performed as follows:

(1) Read one row of qij from memory.
(2) Calculate L(Rj-sum) as follows:

$$L(Rj-\text{sum}) = \left(\Pi_{i' \in R_j} \alpha_{i'j}\right) \phi\left(\sum_{i' \in R_j} \phi(\beta_{i'j})\right)$$

-continued $$\alpha_{ij} = \text{sign}(L(q_{ij})), \beta_{ij} = |L(q_{ij})|,$$

$$\emptyset(x) = -\log\left(\tanh\left(\frac{x}{2}\right)\right) = \log\left(\frac{e^x + 1}{e^x - 1}\right)$$

(3) Calculate the individual $L(r_{ji}) = (\Pi_{i' \in R_{j \setminus i}} \alpha_{i'j}) \emptyset(\Sigma_{i' \in R_{j \setminus i}} \emptyset(\beta_{i'j}))$ for check nodes.
(4) Write back $L(r_{ji})$ to memory.
(5) If this is not the last row of memory, then go to the first step and increment j by one.

Figure 3:
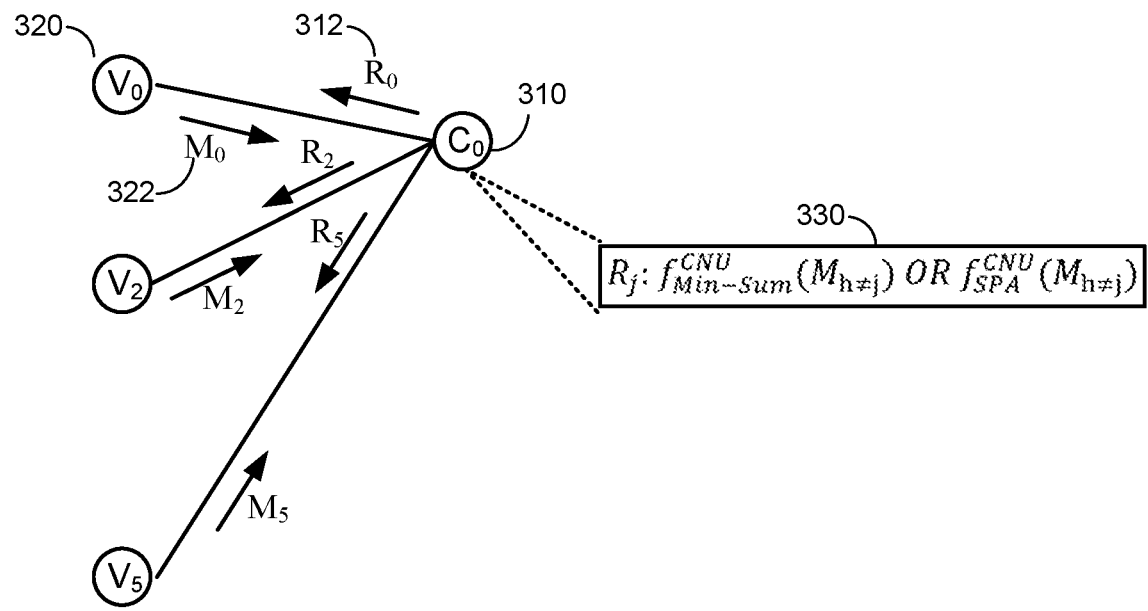
FIG. 3 illustrates an example check node update (CNU) in min-sum (MS) and sum-product algorithm (SPA) decoding available in the prior art.

FIG. 3 illustrates an example check node update (CNU) in min-sum (MS) and sum-product algorithm (SPA) decoding available in the prior art. The example illustrates CNU within the context of a soft-decision decoder. Similar CNU is available for a hard-decision decoder as explained herein above.

As shown, FIG. 3 illustrates a subset of the check nodes (shown with element 310) and variable nodes (shown with element 320) of FIG. 2B. Check node $C_0$ is connected with three variable nodes $V_0$, $V_2$, and $V_5$, where these connections depend on the parity-check matrix. The check node $C_0$ receives messages 322 from the variable nodes thereto. In the illustration of FIG. 3, check node $C_0$ receives messages $M_0$, $M_2$, and $M_5$ from the variable nodes $V_0$, $V_2$, and $V_5$, respectively. Of course, the number and origin of messages depend on the connections between the variable nodes and check nodes.

Generally, a check node $C_i$ receives k messages M from k variable nodes V connected thereto. Each message includes a sign and a value (e.g., $M_j = \{\text{sign, value}\}$ from variable node Vj). The value of Mj indicates a reliability of a bit value for a bit "j" corresponding to the variable node Vj. The sign corresponds to the sign of the value. For instance, the sign of the value provide the LLR associated with the bit. Hence, a message $M_j = \{-, 5\}$ indicates that the LLR of bit "j" is "−5." In other words, the value in the message is the magnitude of the LLR and the sign in the message is the sign of the LLR. The LLRs are indicative of the confidence in zero "0" or one "1" for each codeword bit. For a given codeword bit, a positive LLR value can indicate more confidence in "0" for the bit, a negative LLR value can indicate more confidence in "1" for this bit, and an LLR value of zero can indicate equal likelihood of "0" or "1" for the bit.

Referring back to FIG. 3, the check node $C_0$ responds to the messages $M_0$, $M_2$, and $M_5$ by at least performing CNUs 330. Preforming a CNU uses exclusively either an MS algorithm or an SPA algorithm. In either cases, the check node $C_0$ sends response messages $R_0$, $R_2$, and $R_5$ back to the variable nodes $V_0$, $V_2$, and $V_5$, respectively. FIG. 3 uses element 312 to collectively refer to the response messages $R_0$, $R_2$, and $R_5$. Like an incoming message M, an outgoing response message includes a sign and a value (e.g., $R_j = \{\text{sign, value}\}$ to variable node Vj). The value of Rj indicates a reliability of a bit value for a bit "j" corresponding to the variable node Vj. The sign corresponds to the sign of the value.

To respond to, for example, message $M_5$ from variable node $V_5$, the check node $C_0$ performs a CNU using the messages from the other variable nodes connected thereto (e.g., $M_0$, $M_2$). The sign in the response message $R_5$ is set based on at least applying XOR operation to the signs from the messages $M_0$ and $M_2$. The value in the response message $R_5$ is computed by applying, to the values from the messages $M_0$ and $M_2$, a min-sum function $f_{Min\text{-}Sum}^{CNU}$ if the MS algorithm is used or a SPA function $f_{SPA}^{CNU}$ if the SPA algorithm is used.

Specific to the SPA algorithm, the SPA function $f_{SPA}^{CNU}$ used for the response message $R_5$ is $$2 \tanh^{-1}\left[\tanh\frac{M_0}{2} \times \tanh\frac{M_2}{2}\right].$$

This function is complex to implement in hardware and thus, necessitates a larger circuit area and consumes a larger amount of power relative to a hardware implementation of the min-sum function $f_{Min\text{-}Sum}^{CNU}$. If implemented in software on a general purpose processor, the SPA function $f_{SPA}^{CNU}$ uses more processing cycles and has higher latency relative to a software implementation of the min-sum function $f_{Min\text{-}Sum}^{CNU}$ on the general purpose processor.

Specific to the MS algorithm, the MS function $f_{Min\text{-}Sum}^{CNU}$ used for the response message $R_5$ is much simpler to implement in hardware or in software on a general purpose computer. The overall strategy is that the check node $C_0$ cannot be more confident in a value than the least confident variable node. Accordingly, the check node responds to message $M_5$ by sending the smallest value it has received from the other variable nodes $V_0$ and $V_2$. In particular, the check node check node $C_0$ stores, in storage space accessible to the LDPC decoder, the smallest two values received in messages from the variable nodes connected thereto and the indexes of these two variable nodes. When performing the CNU for variable node $V_5$, the check node $C_0$ compares the value in message $M_5$ to the other two smallest values stored in the storage space. If the value in message $M_5$ is larger than both these values, the check node $C_0$ returns the minimum of the two smallest value to the variable node $V_5$ in the response message $R_5$. If the value in message $M_5$ is larger than one of the two smallest values but smaller than the other one, the check node $C_0$ still returns the minimum of the two smallest value to the variable node $V_5$ in the response message $R_5$ and replaces, in the storage space, the second smallest value and its index with the value in message $M_5$ and the index of variable node $V_5$. If the value in message $M_5$ is smaller than the two smallest values, the check node $C_0$ still returns the minimum of the two smallest value to the variable node $V_5$ in the response message $R_5$. Then, the largest of the two smallest value is removed, the previous minimum smallest value becomes the second smallest value, and the value in message $M_5$ becomes the new minimum smallest value. The indexes are also updated in the storage space.

Here also generally, a check node $C_i$ that receives k messages M from k variable nodes V connected thereto responds back with k response messages R to the k variable nodes, where each response message corresponds to one of these variable nodes. The check node $C_i$ performs a CNU to respond to a message $M_j$ from variable node $V_j$. This CNU involves determining the sign and the reliability value of bit "j," which are then included in the response $R_j$. The sign is determined by applying an XOR operation to at least the signs in the other received messages $M_{h \neq j}$ from the other variable nodes connected to the check node $C_i$. The value is determined by applying the MS function $f_{Min\text{-}Sum}^{CNU}$ of the SPA function $f_{SPA}^{CNU}$ to the values in the other received messages $M_{h \neq j}$ (e.g., $R_j$: $f_{Min\text{-}Sum}^{CNU}(M_{h \neq j})$ OR $f_{SPA}^{CNU}(M_{h \neq j})$).

Specific to the SPA algorithm, the SPA function $f_{SPA}^{CNU}$ for the response message $R_j$ expressed as $$2\tanh^{-1}\left[\prod_h \tanh\frac{M_{h\neq j}}{2}\right],$$

where "h" varies to correspond to the variable nodes $V_h$ connected to the check node $C_i$, except for variable $V_j$ to which the check node is responding. In comparison, the MS function $f_{MS}^{CNU}$ for the response message returns to the variable node Vj the minimum value that is available from the storage space and that is determined based on the values in the other received messages $M_{h\neq j}$. As can be seen, returning a minimum value available from the storage space is much easier to implement and perform in hardware or software on a general purpose computer than the SPA function $f_{SPA}^{CNU}$.

To illustrate the use of MS decoding, consider the example of the messages $M_0$, $M_2$, and $M_5$ including values of "1," "4," and "3," respectively. For clarity, assume that yet another variable node $V_7$ is connected to the check node $C_0$. The two smallest values are 1 and 2, from $M_0$ and $M_5$. The check node $C_0$ stores these two values as "min1=1" and "min2=3" and the corresponding indexes (e.g., "Idx1=0" for variable node $V_0$ and "Idx2=5" for variable node $V_5$). Upon receiving the message $M_7$ from the variable node $V_7$ including a value of "10," the check node $C_0$ determines that the minimum value is "min1=1" and returns this minimum value to variable node $V_7$ in a response message $R_7$. Because the value of "10" in the message $M_7$ is larger than the two smallest values "min1" and "min2," there are no additional updates to these stored values or stored indexes.

An example pseudo code for a CNU using a MS algorithm is provided herein next for illustrative purposes:

```
def CNU (varIdx, magVtoC, signVtoC):
    updateSign(varIdx, signVtoC)
    updateMin1Min2(varIdx, magVtoC)
        return getMsgCtoV(varIdx)
def udpateMin1Min2(varIdx, mVtoC):
    if (varIdx == min1Idx)
        if (mVtoC < min2)
            min1 = mVtoC
        else
            min1 = min2
            min1Idx = min2Idx
            min2 = mVtoC
            min2Idx = varIdx
    else if (varIdx == min2Idx)
        if (mVtoC < min1)
            min1 = mVtoC
            min1Idx = varIdx
            min2 = min1
            min2Idx = min1Idx
        else
            min2 = mVtoC
    else
        if (mVtoC < min1)
            min1 = mVtoC
            min1Idx = varIdx
            min2 = min1
            min2Idx = min1Idx
        else if (mVtoC < min2)
            min2 = mVtoC
            min2Idx = varIdx
def updateSign(varIdx, newSign):
    if (allSigns[varIdx] != newSign)
        allSigns[varIdx] = newSign
        checkSign = checkSign * -1
def getMsgCtoV(varIdx):
    sign = checkSign * allSigns[varIdx]
    if (varIdx == min1Idx)
        return min2 * sign
    else
        return min1 * sign
```

Figure 4:
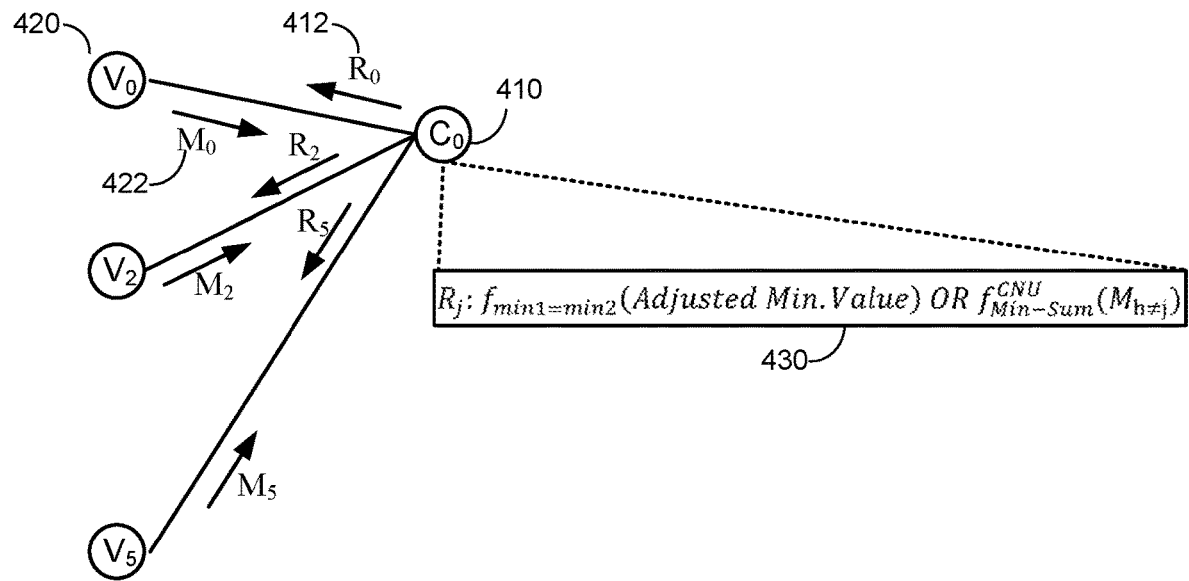
FIG. 4 illustrates an example check node update (CNU) in a modified min-sum (MS) decoding, in accordance with certain embodiments of the present disclosure.

FIG. 4 illustrates an example check node update (CNU) in a modified min-sum (MS) decoding, in accordance with certain embodiments of the present disclosure. The example illustrates CNU within the context of a soft-decision decoder. Similar CNU is available for a hard-decision decoder as explained herein above.

As shown, FIG. 4 illustrates a subset of the check nodes (shown with element 410) and variable nodes (shown with element 420) of FIG. 2B. Like in FIG. 3, the check node $C_0$ is connected with three variable nodes $V_0$, $V_2$, and $V_5$, where these connections depend on the parity-check matrix. The check node $C_0$ receives messages 422 from the variable nodes thereto. Also like in the illustration of FIG. 3, the check node $C_0$ receives messages $M_0$, $M_2$, and $M_5$ from the variable nodes $V_0$, $V_2$, and $V_5$, respectively and responds to each of these messages with a response message $R_0$, $R_2$, and $R_5$ (collectively shown with element 412). Of course, the number and origin of messages depend on the connections between the variable nodes and check nodes.

To respond to a message from a variable node connected thereto, a check node $C_i$ performs a CNU 430 by using the messages from the remaining variable nodes connected thereto. The CNU operation for the sign in the response message is similar to what is described herein above. In comparison, the CNU operation for the value in the response message changes.

In an example, the CNU 430 uses the MS function $f_{Min-Sum}^{CNU}$ as described herein above for all events when the two stored smallest values are different from each other (e.g., "min1≠min2"). However, upon detecting the event when the two smallest values are equal and, hence, both are the minimum (e.g., "min1≠min2"), the CNU 430 uses a modified MS function to approximate the minimum value that the SPA function would output.

In particular, instead of returning the minimum value, the check node $C_i$ generates an adjusted minimum value by adjusting the minimum value (e.g., "min1" or "min2") by an adjustment value (e.g., "adjusted minimum value=min1−adjustment value"), and returns the adjusted minimum value in the response message.

To illustrate, consider the example when the values in messages $M_0$ and $M_2$ are equal and are the minimum (e.g., "min1=min2=1"). In that case, the check node $C_0$ would have stored these two values and the indexes of the corresponding variable nodes in the storage space (e.g., "Idx1=0 and Idx2=2"). Upon receiving the message $M_5$ from the variable node $V_5$, the check node $C_0$ returns an adjusted minimum value instead of the minimum value from the messages $M_0$ and $M_2$. In the interest of clarity, consider the example of "0.75" as the adjustment value. Accordingly, the adjusted minimum value is "min1−0.75=1−0.25=0.25." The response message $R_5$ includes this "0.25" value instead of "min1."

Continuing with this example, if the value in message $M_5$ is larger than the minimum value (e.g., the value in $M_5$ larger than min1=min2), no additional updates are needed. However, if the value is smaller than this previously stored minimum value (e.g., the value in $M_5$ is smaller than min1=min2), then the value in message $M_5$ becomes the new smallest value and the previously stored minimum value becomes the second smallest value. The index of variable node $V_5$ replaces one of the two stored indexes for the minimum value in the storage space (e.g., "Idx1=5" and "Idx2=0 or 2").

The below pseudo code illustrates the change to the "getMsgCtoV" operation to implement the modified MS decoding in software:

```
def getMsgCtoV(varIdx):
    sign = checkSign * allSigns[varIdx]
    if (varIdx = min1Idx)
        return min2 * sign
    else if (varIdx == min2Idx)
        return min1 * sign
    else
    return combine(min1, min2) * sign
def combine(min1, min2):
    if (min1 == min2 and min1 > 0)
        return (min1-1)
    else
        return min1
```

The adjustment value can be defined based on various parameters such that the adjusted minimum value is the same or similar to the value that the SPA decoding would have computed upon a CNU. One parameter relates to the type of decoder. If a soft-input decoder is used, the adjustment value is selected from a range of values and can be a decimal value. This range can be defined based on a simulation of a CNU using MS decoding and of a CNU using SPA decoding (with soft decoding), as further illustrated in the next figures. In an example, the range is for values between 0.6 and 0.9. In a specific example, the adjustment value is set as 0.75. If a hard-input decoder is used, the adjustment value is selected from a range of integers and can be only an integer. This range can also be defined based on the simulation, but with hard decoding. In an example, the range is for integers between one and five. In a specific example, the adjustment value is set as one.

Another parameter relates to the number of iterations in the iterative LDPC decoding. In an example, a rule is defined and stored in the storage space. The rule specifies that the adjustment value increases with an increase of the iteration number. For example, the adjustment value starts at 0.6 and gradually increases to 0.9 when the iteration number reaches twenty. Of course, using this parameter assumes that the adjustment value is dynamic. Nonetheless, the adjustment value can be static (e.g., set to 0.75 and does not change with the number of iterations) or hybrid (e.g., set to 0.75 and does not change, but is not used until the number of iterations exceeds a threshold number such as five iterations).

Figure 5:
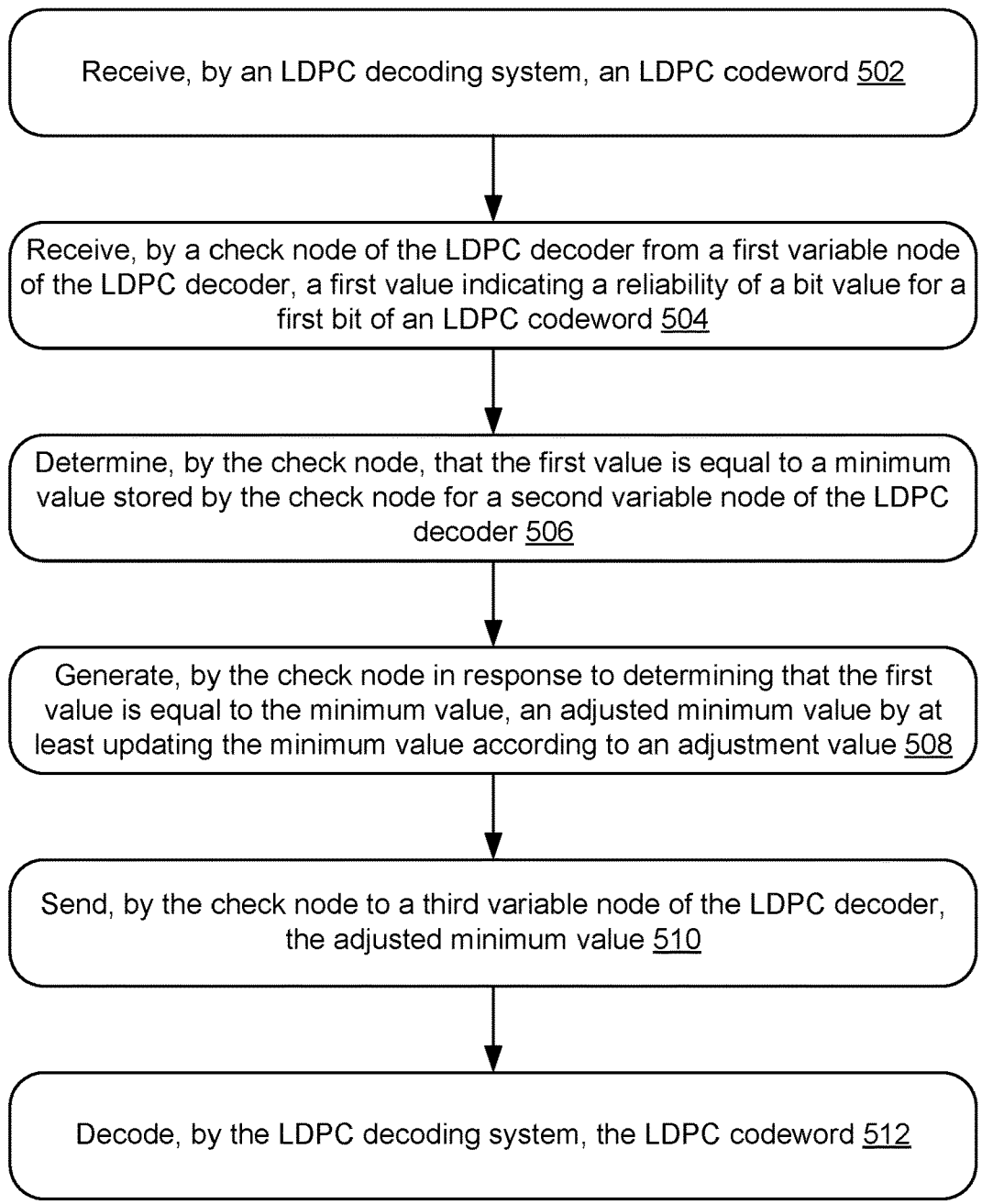
FIG. 5 illustrates an example flow for using a modified min-sum (MS) decoding as part of a check node update (CNU) for decoding an LDPC codeword, in accordance with certain embodiments of the present disclosure.

FIG. 5 illustrates an example flow 500 for using a modified min-sum (MS) decoding as part of a check node update (CNU) for decoding an LDPC codeword, in accordance with certain embodiments of the present disclosure. An LDPC decoding system is described as performing particular operations of the example flow 500. In particular, this system can be implemented as part of an error correcting system that includes a decoder, such as the error correcting system 100 of FIG. 1. The LDPC decoding system may have a specific hardware configuration to perform some of operations of the error correcting system, including the operations of the decoder (e.g., an iterative decoder such as the LDPC decoder 140 of FIG. 1). Alternatively or additionally, the LDPC decoding system may include generic hardware configured with specific instructions. In an example, the system includes one or more processors and one or more memories. The memory(ies) stores computer-readable instructions to embody functionalities specific to the LDPC decoding system. The instructions when executed by the processor(s) of the system result in performance of the functionalities by the system. The instructions stored in the memory(ies) in conjunction with the underlying processor(s) represent a means for performing the functionalities. Although the operations are illustrated in a particular order, other arrangements of the operations are possible and some of the operations may be skipped as it would be apparent to a person skilled in the art. In the interest of clarity of explanation, the example flow 500 is illustrated using a check node connected with three variable nodes. However, the example flow 500 similarly apply to larger and different number of check nodes and variable nodes.

As illustrated, the example flow 500 starts at operation 502, where the LDPC decoding system receives an LDPC codeword. For example, the LDPC decoding system accesses LDPC codewords stored in a storage space. The LDPC decoding system includes an LDPC decoder, implemented in special purpose hardware or in software on general purpose hardware. The LDPC decoder uses variable nodes and check nodes to decode the LDPC codeword. The decoding is iterative and relies on message passing between the variable nodes and check nodes. In response to messages received from the variable nodes, the check nodes perform CNU operations that rely on a modified min-sum function.

At operation 504, a check node of the LDP decoder receives, from a first variable node of the LDPC decoder, a first value indicating a reliability of a bit value for a first bit of the LDPC codeword. For example, the first variable node corresponding to the first bit is connected to the check node. As a part of the iterative decoding and its message passing, the check node receives a first message from the first variable. The first message includes a first sign for the first bit and the first value. The first sign and the first value represent the LLR of the first bit. In other words, the first value is the magnitude of the LLR. The bit value indicates whether the bit is a "0" or a "1."

At operation 506, the check node determines that the first value is equal to a minimum value stored by the check node for a second variable node of the LDPC decoder. For example, the second variable node corresponds to a second bit of the LDPC codeword and is connected to the check node. This second value was previously stored based on a second message received by the check node from the second variable node and, at that time, was compared to values received in other messages by the check nodes and determined to be the smallest value. The second message can also include a second sign for the second bit. The second value is available from a storage space accessible to the LDPC decoder. This storage space also stores an index of the second variable node.

At operation 508, the check node generates, in response to determining that the first value is equal to the minimum value, an adjusted minimum value by at least updating the minimum value according to an adjustment value. In an example, this operation is performed only when the value is equal to the minimum value. If the two values are not equal, typical MS decoding is used for a CNU without using the adjustment value.

The adjustment value can be static or can be dynamic. If dynamic, the adjustment value can be set based on the number of the LDPC decoding iteration. Either way, the adjustment value is available from the storage space (e.g., either as one value if static, or as a table that associates particular values with iteration numbers if dynamic). The minimum value is adjusted by subtracting the adjustment value from it.

At operation 510, the check node sends, to a third variable node of the LDPC decoder, the adjusted minimum value. For example, the third variable node corresponds to a third bit of the LDPC codeword and is connected to the check node. The adjusted minimum value can be sent in a response message to the third variable node in response to receiving a third message from the third variable node. This third message may include a third sign for the third bit and a third value indicating a reliability for the third bit. The adjusted minimum value may be generated prior to receiving this third message or may be generated in response to receiving the third message.

At operation 512, the LDPC decoding system decodes the LDPC codeword. For example, the LDPC decoder uses the adjusted minimum value received by the third variable node to decode the third bit. This decoding can also use the sign for the third bit, where this sign is received by the third variable in the response message from the check node. Similarly, each bit (e.g., the first bit and second bit of the LDPC codeword) is decoded according to the value and sign received by the corresponding variable node in the respective response message from the check node. The decoding can be iterative, where the messages between the variable nodes and the check nodes are exchanged over multiple iterations until successful decoding of the LDPC codeword or a maximum number of decoding iterations is reached.

To further illustrate the decoding of the first and second bits, additional operations of the example flow 500 (not shown in FIG. 5) include sending, by the check node, the minimum value without being adjusted to the first variable node and the second variable node. The minimum value, rather than the adjusted minimum value, is used for decoding the first bit and the second bit.

FIG. 6 illustrates an example flow 600 for defining an adjustment value based on a simulation of a check node update using min-sum decoding and a check node update using a sum-product algorithm decoding, in accordance with certain embodiments of the present disclosure. A system is described as performing particular operations of the example flow 600. In particular, this system can be implemented as part of a testing or design platform for designing an error correction system. The system may have a specific hardware configuration to perform some of operations of the example flow 600. Alternatively or additionally, the system may include generic hardware configured with specific instructions. In an example, the system includes one or more processors and one or more memories. The memory(ies) stores computer-readable instructions to embody functionalities specific to the LDPC decoding system. The instructions when executed by the processor(s) of the system result in performance of the functionalities by the system. The instructions stored in the memory(ies) in conjunctions with the underlying processor(s) represent a means for performing the functionalities. Although the operations are illustrated in a particular order, other arrangements of the operations are possible and some of the operations may be skipped as it would be apparent to a person skilled in the art.

As illustrated, the example flow 600 starts at operation 602, where the system varies a first minimum value while maintaining a second minimum values. For example, the first and second minimum values indicate reliabilities of bit values. In particular, each of these values can be a value sent in a message from a variable node to a check node. Upon comparison to other values received by the check node, the first and second values can be determined to be the two smallest values received by the check node. As such, these two values represent the "min1" and "min2" values that the check node would store for performing CNUs using MS decoding. The second minimum value can be set to a constant (e.g., eight), while the first minimum value can be varied within a range that contains this constant (e.g., zero to fifteen).

At operation 604, the system measures a first output of a first CNU and a second output of a second CNU when varying the first minimum value and maintaining the second minimum value. For example, the first CNU uses MS decoding. The second CNU uses SPA decoding. The first output is the value included in the response message from the check node performing the first CNU for a given first minimum value and the constant second minimum value. Similarly, the second output is the value included in the response message from the check node performing the second CNU for the same given first minimum value and the constant second minimum value. In other words, the first output represents the value that the check node would respond when using the MS decoding and the second output represents the value that the check node would respond when using the SPA decoding. The difference between the two outputs indicates the overestimation resulting from using the MS decoding for the CNUs.

At operation 606, the system generates curves showing the measurements as a function of the variable first minimum value. For example, the horizontal axis of a plot corresponds to the first minimum value whereas the vertical axis of the plot corresponds to the first output and the second output. Examples of such plots are further illustrated in FIG. 7. As such, the CNU outputs are plotted as functions of the first minimum value.

At operation 608, the system determines a gap between the first output and the second output based on the measurements. For example, the gap is the difference between the first output (corresponding to the MS decoding) and the second output (corresponding to the SPA decoding). The difference can be plotted as a function of the first minimum value as illustrated in FIG. 7.

At operation 610, the system sets an adjustment value based on the gap. For example, the adjustment value is set as the largest size of the gap or a range is derived from the gap (e.g., such as plus/minus twenty percent around the peak of the gap).

FIG. 7 illustrates example simulations of check node updates using min-sum decoding and sum-product algorithm (SPA) decoding, in accordance with certain embodiments of the present disclosure. Four plots are illustrated. The top two plots show simulations of CNU outputs by varying a first minimum value 702 between zero and fifteen and maintaining a second minimum value 704 constant. The top left plot is for this constant set to eight, while the top right plot is for this constant set to twelve.

In these two top plots, the first output is plotted against the first minimum value and corresponds to CNUs that use MS decoding. This plotting is shown using curve 710. Similarly, the second output is plotted against the first minimum value and corresponds to CNUs that use SPA decoding. This plotting is shown using curve 720.

The bottom two plots correspond to the top two plots and show the differences between the two outputs. In particular, the bottom left plot plots the difference between the first output and the second output as a function of the first minimum value 702 when the second minimum value 704 is set to eight. In comparison, the bottom right plot plots the difference between the first output and the second output as a function of the first minimum value 702 when the second minimum value 704 is set to twelve. The curve 720 in the bottom plots represents the difference. The peak 722 of the curve 720 represents the largest size of the gap or difference between the two outputs.

As shown in the four plots, regardless of the actual magnitudes of the first and second minimum values, the largest gap between the two outputs occurs when these two minimum values are the same (e.g., when the first minimum value=the second minimum value=8 (in the left plots) and 12 (in the right plots)). This largest gap is about "0.75" as shown in the bottom plots. Accordingly, the adjustments value can be set to "0.75" and used when a check node determines that the two smallest values in messages received from variable nodes are equal. In this way, the minimum value generated by the MS decoding is reduced by "0.75" to approximate the minimum value that the SPA decoding would have generated (e.g., by minimizing or closing the gap between the two outputs).

Figure 8:
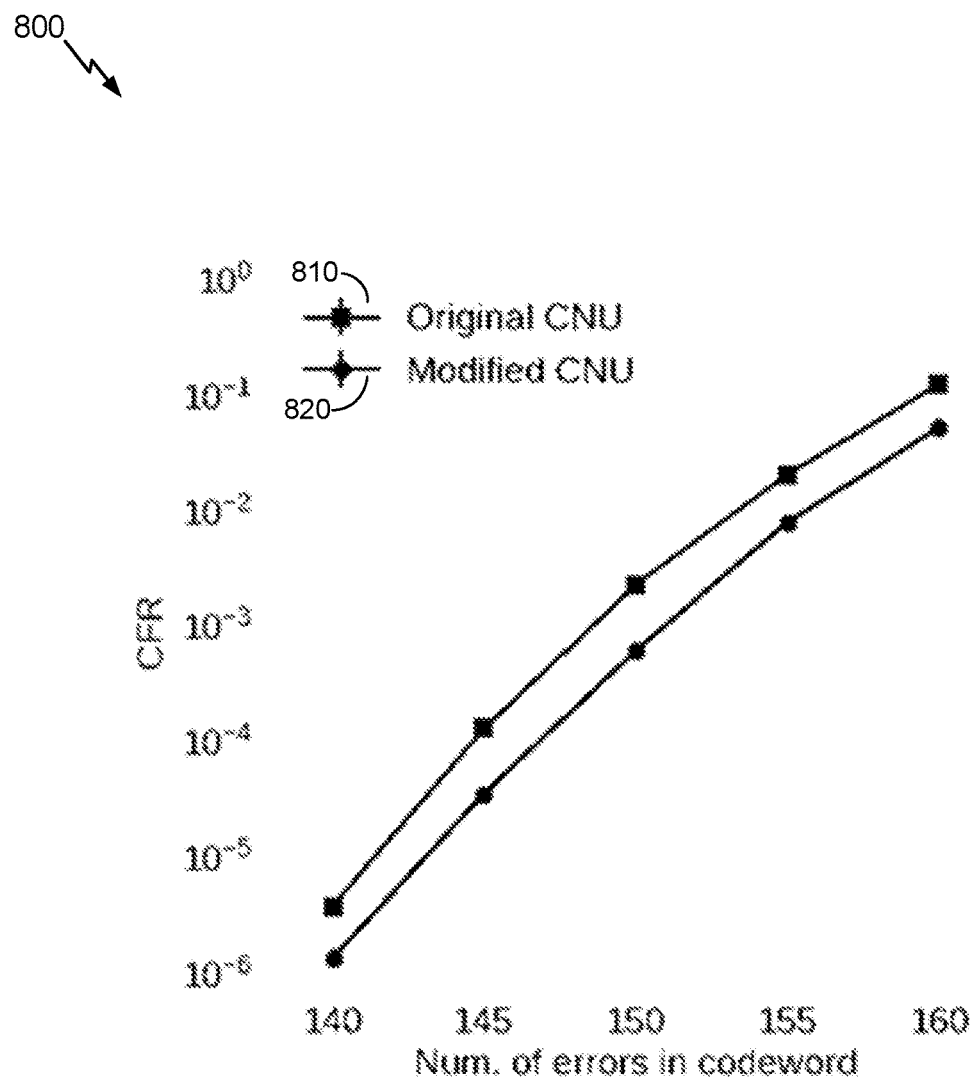
FIG. 8 illustrates an example of a performance comparison between CNUs using typical min-sum decoding and CNUs using a modified min-sum decoding in accordance with certain embodiments of the present disclosure.

FIG. 8 illustrates an example of a performance comparison between CNUs using typical min-sum decoding and CNUs using a modified min-sum decoding in accordance with certain embodiments of the present disclosure. The horizontal axis corresponds to the number of errors in codeword. The vertical axis corresponds to the code failure rate. The performance (e.g., in terms of code failure rate as a function of the number of errors) of CNUs using the typical MS decoding is shown with curve 810. The performance of CNUs using the modified MS decoding is shown with curve 820. As illustrated, the performance of CNUs using the modified MS decoding is far superior (e.g., lower code failure rate for all numbers of errors).

Figure 9:
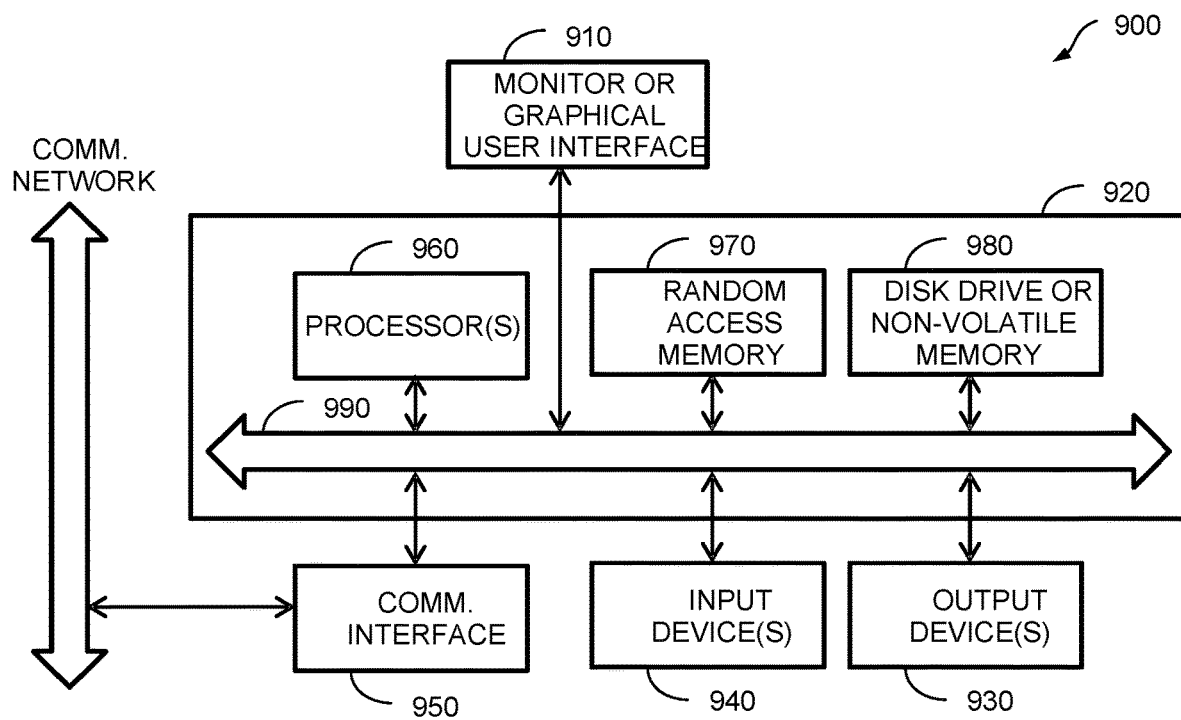
FIG. 9 describes one potential implementation of a system which may be used, according to certain embodiments of the present disclosure.

FIG. 9 describes one potential implementation of a system which may be used, according to certain embodiments of the present disclosure. FIG. 9 is merely illustrative of an embodiment of the present disclosure and does not limit the scope of the disclosure as recited in the claims. In one embodiment, the system is a computer system 900 that typically includes a monitor 910, a computer 920, user output devices 930, user input devices 940, communications interface 950, and the like.

As shown in FIG. 9, the computer 920 may include a processor(s) 960 that communicates with a number of peripheral devices via a bus subsystem 990. These peripheral devices may include the user output devices 930, the user input devices 940, the communications interface 950, and a storage subsystem, such as random access memory (RAM) 970 and disk drive 980.

The user input devices 930 include all possible types of devices and mechanisms for inputting information to the computer system 920. These may include a keyboard, a keypad, a touch screen incorporated into the display, audio input devices such as voice recognition systems, microphones, and other types of input devices. In various embodiments, the user input devices 930 are typically embodied as a computer mouse, a trackball, a track pad, a joystick, wireless remote, drawing tablet, voice command system, eye tracking system, and the like. The user input devices 930 typically allow a user to select objects, icons, text and the like that appear on the monitor 910 via a command such as a click of a button or the like.

The user output devices 940 include all possible types of devices and mechanisms for outputting information from the computer 920. These may include a display (e.g., the monitor 910), non-visual displays such as audio output devices, etc.

The communications interface 950 provides an interface to other communication networks and devices. The communications interface 950 may serve as an interface for receiving data from and transmitting data to other systems. Embodiments of the communications interface 950 typically include an Ethernet card, a modem (telephone, satellite, cable, ISDN), (asynchronous) digital subscriber line (DSL) unit, FireWire interface, USB interface, and the like. For example, the communications interface 950 may be coupled to a computer network, to a FireWire bus, or the like. In other embodiments, the communications interfaces 950 may be physically integrated on the motherboard of the computer 920, and may be a software program, such as soft DSL, or the like.

In various embodiments, the computer system 900 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 920 includes one or more Xeon microprocessors from Intel as the processor(s) 960. Further, one embodiment, the computer 920 includes a UNIX-based operating system.

The RAM 970 and the disk drive 980 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 970 and the disk drive 980 may be configured to store the basic programming and data constructs that provide the functionality of the present disclosure.

Software code modules and instructions that provide the functionality of the present disclosure may be stored in the RAM 970 and the disk drive 980. These software modules may be executed by the processor(s) 960. The RAM 970 and the disk drive 980 may also provide a repository for storing data used in accordance with the present disclosure.

The RAM 970 and the disk drive 980 may include a number of memories including a main random access memory (RAM) for storage of instructions and data during program execution and a read only memory (ROM) in which fixed non-transitory instructions are stored. The RAM 970 and the disk drive 980 may include a file storage subsystem providing persistent (non-volatile) storage for program and data files. The RAM 970 and the disk drive 980 may also include removable storage systems, such as removable flash memory.

The bus subsystem 990 provides a mechanism for letting the various components and subsystems of the computer 920 communicate with each other as intended. Although the bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A low density-parity check (LDPC) method involving a min-sum based decoding approach and implemented on an LDPC decoder, the LDPC method comprising:
   receiving, by a check node of the LDPC decoder from a first variable node of the LDPC decoder, a first value indicating a reliability of a bit value for a first bit of an LDPC codeword, the first variable node corresponding to the first bit and connected to the check node;
   determining, by the check node, that the first value is equal to a minimum value stored by the check node for a second variable node of the LDPC decoder, the second variable node corresponding to a second bit of the LDPC codeword and connected to the check node;
   generating, by the check node in response to determining that the first value is equal to the minimum value, an adjusted minimum value by at least updating the minimum value according to an adjustment value; and
   sending, by the check node to a third variable node of the LDPC decoder, the adjusted minimum value, the third variable node corresponding to a third bit of the LDPC codeword and connected to the check node,
   wherein the third bit is decoded based on the adjusted minimum value.

2. The LDPC method of claim 1, further comprising:
   sending, by the check node, the minimum value without being adjusted to the first variable node and the second variable node, wherein the first bit and the second bit are decoded based on the minimum value without being adjusted.

3. The LDPC method of claim 1, wherein the first value is received in a first message from the first variable node, wherein the first message includes a first sign for the first bit, and further comprising:
   receiving, by the check node from the second variable node, a second message that includes the minimum value and a second sign for the second bit;
   determining, by the check node, that the minimum value is the smallest value among values received in messages from variable nodes connected to the check node; and
   replacing, by the check node, a previously stored minimum value with the smallest value and updating a stored index to include an identifier of the second variable node.

4. The LDPC method of claim 3, further comprising:
   receiving, by the check node, a third message from the third variable node, the third message including a third value indicating a reliability of a bit value for the third bit and a third sign for the third bit; and
   responding, by the check node to the third message, with a response message sent to the third variable node, wherein the response message includes the adjusted minimum value.

5. The LDPC method of claim 4, further comprising:
   generating, by the check node, an update to the third sign by at least applying an XOR operation to the first sign and the second sign, wherein the response message further includes the update to the third sign.

6. The LDPC method of claim 1, wherein the LDPC decoder is a soft input decoder, and wherein the adjustment value is selected from a range of 0.6 and 0.9.

7. The LDPC method of claim 6, wherein the adjustment value is set as 0.75.

8. The LDPC method of claim 1, wherein the LDPC decoder is a hard input decoder, and wherein the adjustment value is set as an integer.

9. The LDPC method of claim 8, wherein the integer is set as one.

10. The LDPC method of claim 1, wherein the LDPC decoder uses iterative LDPC decoding, and wherein the adjustment value changes based on an iteration number of the iterative LDPC decoding.

11. The LDPC method of claim 10, wherein the adjustment value increases with an increase of the iteration number.

12. The LDPC method of claim 1, wherein the adjustment value is available from a storage space accessible to the LDPC decoder and is stored in the storage space based on a simulation of a first check node update (CNU) using min-sum decoding and of a second CNU using a sum-product algorithm (SPA) decoding.

13. The LDPC of claim 12, wherein the simulation comprises:
varying a first minimum value while maintaining a second minimum value, the first and second minimum values indicating reliabilities of bit values;
measuring a first output of the first CNU and a second output of the second CNU when varying the first minimum value and maintaining the second minimum value;
determining a gap between the first output and the second output based on the measuring; and
setting the adjustment value based on the gap.

14. A low density-parity check (LDPC) decoding system comprising:
one or more processors; and
one or more memories communicatively coupled with the one or more processors and storing instructions that, upon execution by the one or more processors, configure the LDPC decoding system to at least:
receive an LDPC codeword; and
decoded bits of the LDPC codewords based on a plurality of variable nodes connected to a plurality of check nodes, wherein the decoding of the bits comprises:
receiving, by a check node from a first variable node, a first value indicating a reliability of a bit value for a first bit of the LDPC codeword, the first variable node corresponding to the first bit and connected to the check node;
determining, by the check node, that the first value is equal to a minimum value stored by the check node for a second variable node, the second variable node corresponding to a second bit of the LDPC codeword and connected to the check node;
generating, by the check node in response to determining that the first value is equal to the minimum value, an adjusted minimum value by at least updating the minimum value according to an adjustment value; and
sending, by the check node to a third variable node, the adjusted minimum value, the third variable node corresponding to a third bit of the LDPC codeword and connected to the check node,
wherein the third bit is decoded based on the adjusted minimum value.

15. The LDPC decoding system of claim 14, wherein the decoding of the bits further comprises:
storing the minimum value in a storage space;
storing a first index corresponding to the first variable node and a second index corresponding to the second variable node in the storage space, wherein the first index is stored based on determining that the first value is equal to the minimum value and is received from the first variable node, and wherein the second index is stored based on determining that the minimum value is the smallest value among values received from variable nodes connected to the check node.

16. The LDPC decoding system of claim 15, wherein the decoding of the bits further comprises:
receiving, by the check node from the third variable node, a third value indicating a reliability of a bit value for the third bit of the LDPC codeword;
determining, by the check node, that the third value is greater than the minimum value and that a third index corresponding to the third variable node is different from the first index and the second index; and
sending, by the check node, the adjusted minimum value in a response message to the third variable node.

17. One or more non-transitory computer storage media comprising instructions that, upon execution on a low density-parity check (LDPC) decoding system, configure the LDPC decoding system to perform operations comprising:
receiving an LDPC codeword; and
decoding bits of the LDPC codewords based on a plurality of variable nodes connected to a plurality of check nodes, wherein the decoding of the bits comprises:
receiving, by a check node from a first variable node, a first value indicating a reliability of a bit value for a first bit of the LDPC codeword, the first variable node corresponding to the first bit and connected to the check node;
determining, by the check node, that the first value is equal to a minimum value stored by the check node for a second variable node, the second variable node corresponding to a second bit of the LDPC codeword and connected to the check node;
generating, by the check node in response to determining that the first value is equal to the minimum value, an adjusted minimum value by at least updating the minimum value according to an adjustment value; and
sending, by the check node to a third variable node, the adjusted minimum value, the third variable node corresponding to a third bit of the LDPC codeword and connected to the check node,
wherein the third bit is decoded based on the adjusted minimum value.

18. The one or more non-transitory computer storage media of claim 17, wherein the adjustment value is selected from a rage of 0.6 and 0.9.

19. The one or more non-transitory computer storage media of claim 17, wherein the adjustment value is set as an integer.

20. The one or more non-transitory computer storage media of claim 17, wherein the decoding of the bits includes iterative LDPC decoding, and wherein the adjustment value increases with an increase of an iteration number of the iterative LDPC decoding.

* * * * *